United States Patent [19]

Kuhn

[11] 4,375,693

[45] Mar. 1, 1983

[54] ADAPTIVE SWEEP BIT SYNCHRONIZER

[75] Inventor: William B. Kuhn, Conyers, Ga.

[73] Assignee: Ford Aerospace & Communications Corporation, Detroit, Mich.

[21] Appl. No.: 257,011

[22] Filed: Apr. 23, 1981

[51] Int. Cl.$^3$ .............................................. H03L 7/06
[52] U.S. Cl. .................................. 375/120; 307/511; 307/527; 328/63; 331/4
[58] Field of Search ............... 307/480, 511, 514, 518, 307/527; 328/63, 72, 74, 155; 331/1 A, 4; 375/106, 110, 120

[56] References Cited

U.S. PATENT DOCUMENTS

| | | | |
|---|---|---|---|
| 3,646,452 | 2/1972 | Horowitz et al. | 328/63 |
| 3,781,695 | 12/1973 | Jackson | 328/155 |
| 3,959,601 | 5/1976 | Olevsky et al. | 375/120 |
| 4,019,153 | 4/1977 | Cox, Jr. et al. | 331/1 A |
| 4,031,317 | 6/1977 | McClain et al. | 375/109 |
| 4,077,016 | 2/1978 | Sanders et al. | 331/4 |
| 4,079,329 | 3/1978 | England et al. | 375/120 |
| 4,122,405 | 10/1978 | Tietz et al. | 331/1 A |
| 4,166,979 | 9/1979 | Waggener | 375/120 |
| 4,210,776 | 7/1980 | VanMeter | 375/120 |
| 4,316,152 | 2/1982 | Meyer | 331/1 A |

OTHER PUBLICATIONS

Bellisio, J. A., "A New Phase Locked Timing Recovery Method for Digital Regenerators", *IEEE, International Conference on Communications,* Jun. 1976, Philadelphia, Pa., pp. 10–17 et seq.

*Primary Examiner*—Benedict V. Safourek
*Attorney, Agent, or Firm*—Edward J. Radlo; Robert D. Sanborn

[57] ABSTRACT

A partly analog partly digital bit synchronizer capable of acquisition and operation over an arbitrarily broad range of data rates is disclosed. A second order phase lock loop (PLL) is employed providing both phase and frequency correction to a voltage controlled oscillator (VCO). The phase detector consists of a binary counter whose most significant bit (MSB) is defined to be the recovered clock. The desired data transition points are defined as coinciding with the falling edge of the counter's MSB. At each data transition, the least significant bits within the counter are used to set the duration of phase and frequency correction pulses proportional to the phase error, which pulses are then fed to the VCO. An acquisition circuit diverts the frequency correction pulses in order to sweep the VCO within a selected half octave. Lock is recognized when a preselected number of data transitions with phase error below a preset maximum occur consecutively. An autorange capability automatically steps the frequency through half octaves within an arbitrarily large range.

6 Claims, 13 Drawing Figures

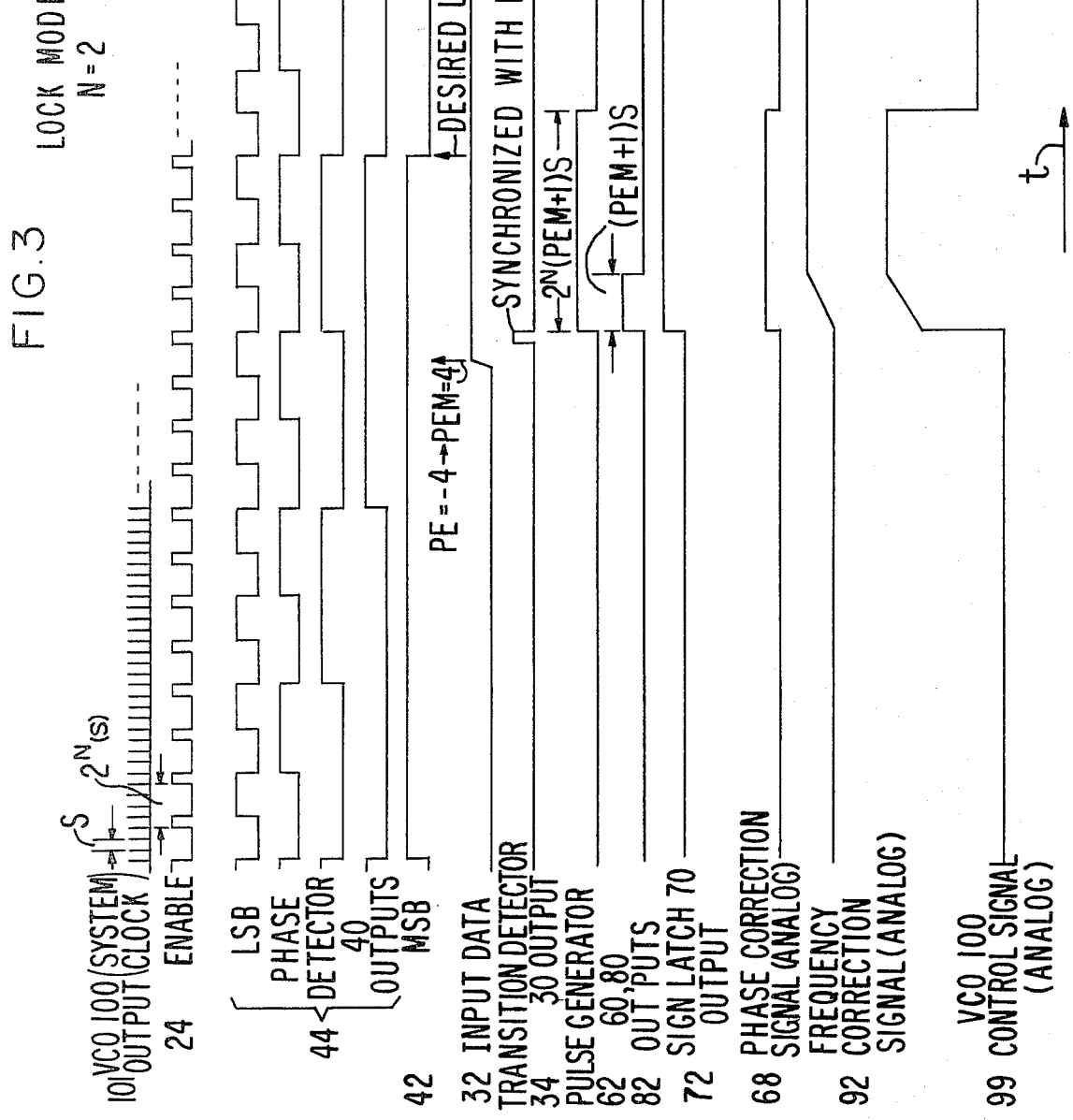

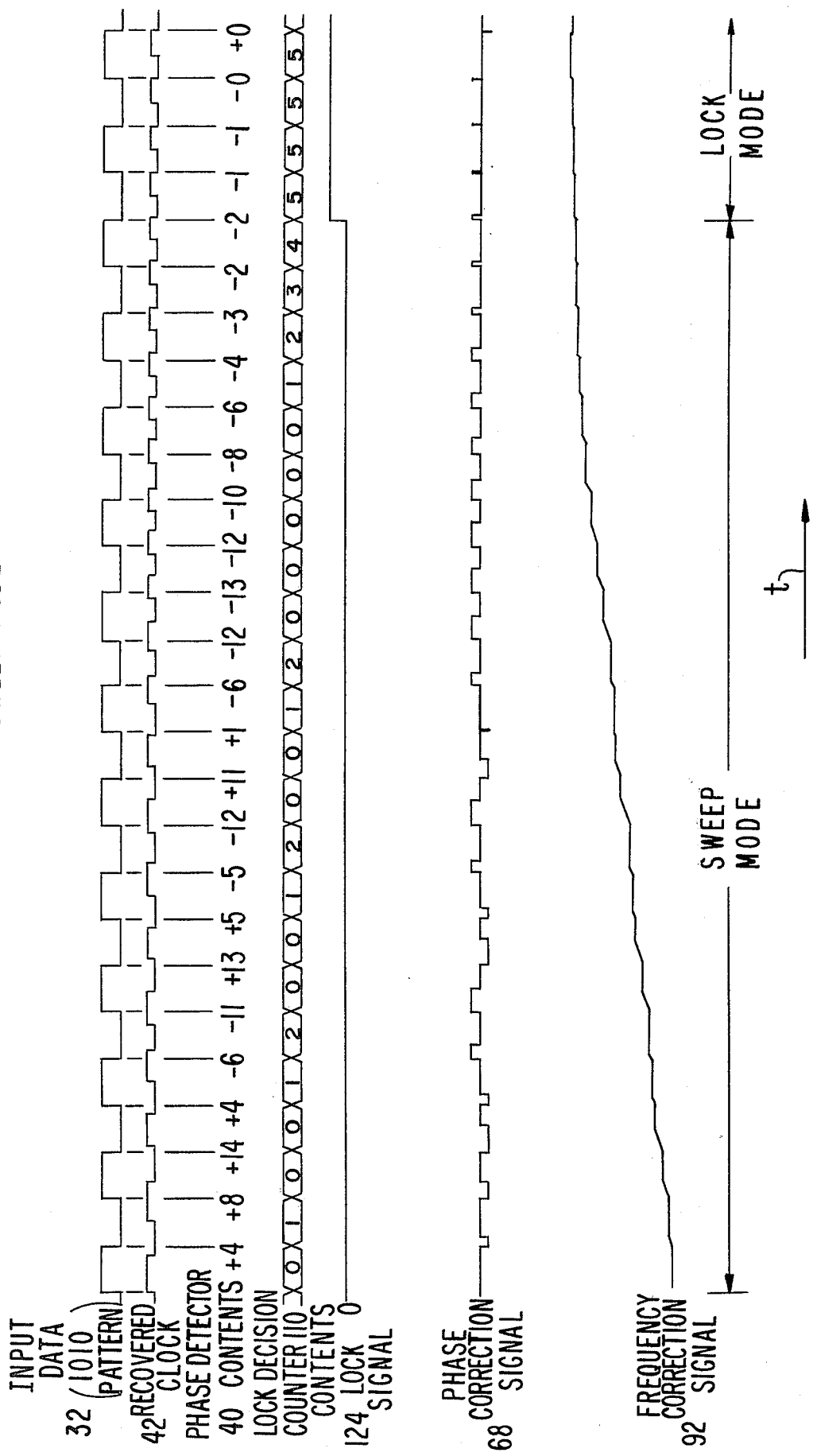

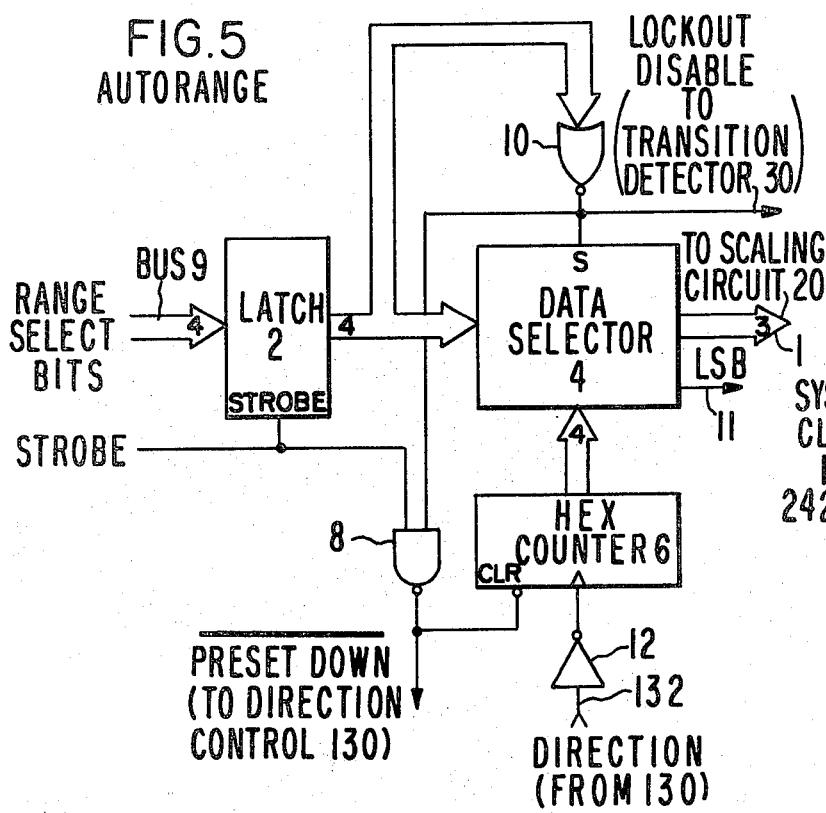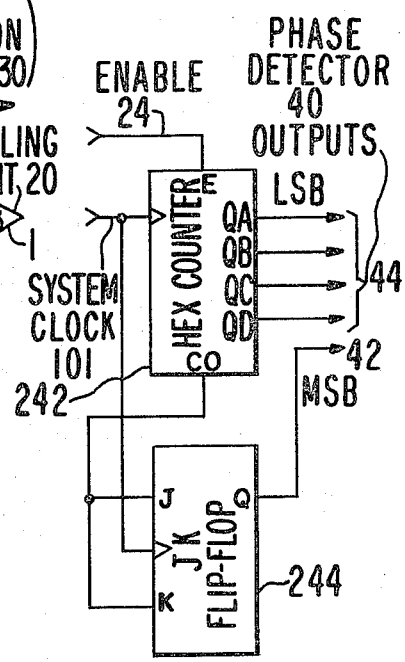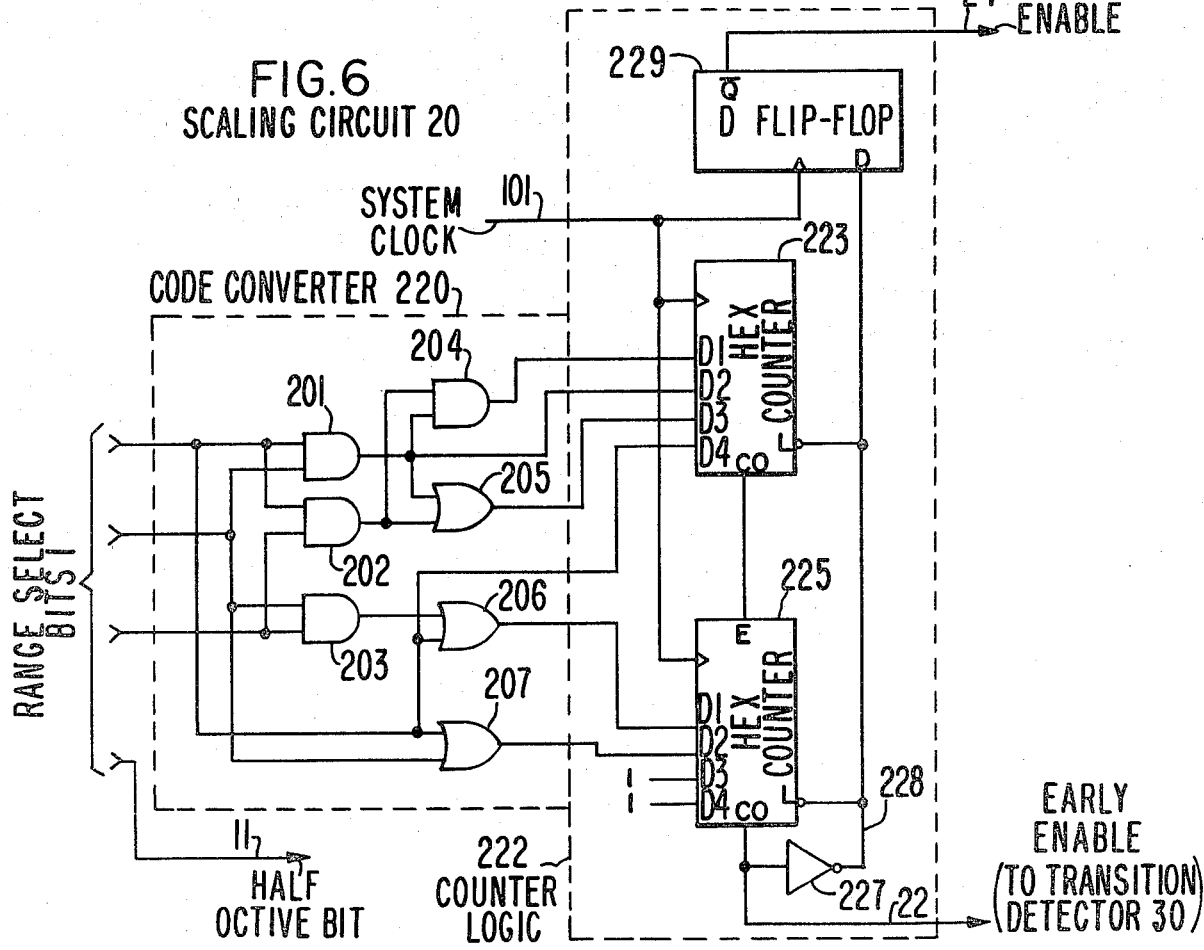

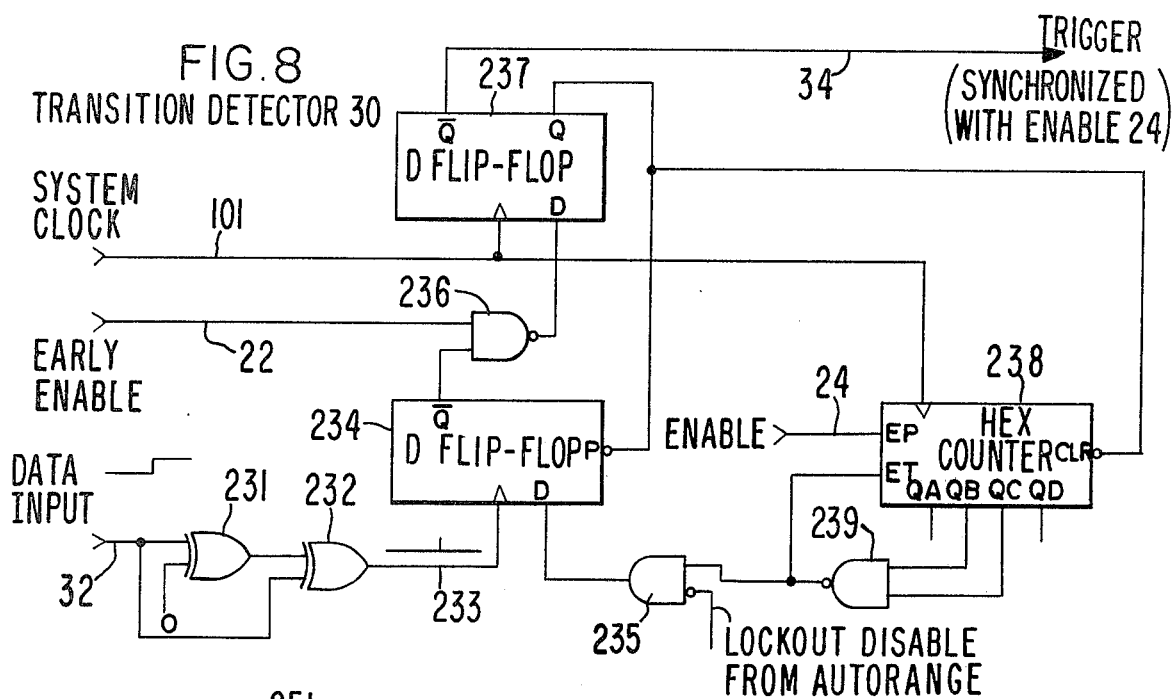
FIG.8 TRANSITION DETECTOR 30
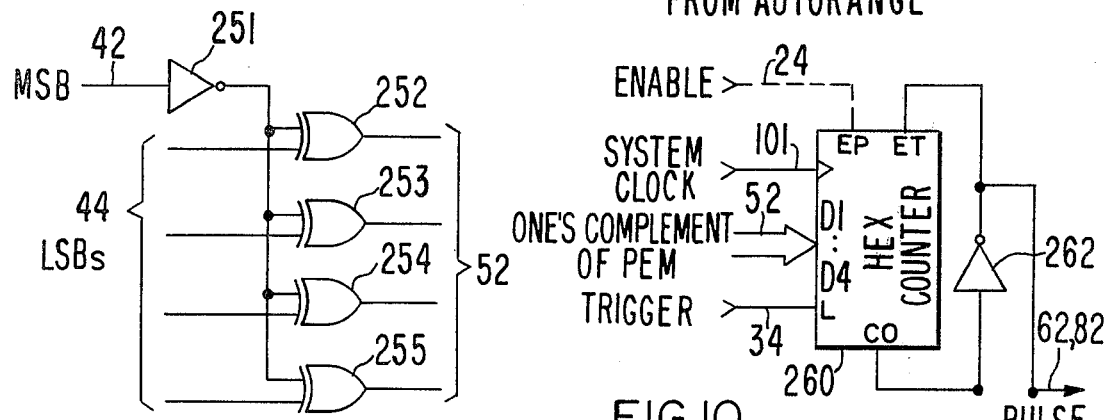
FIG.9 ONE'S COMPLEMENT DECODER 50
FIG.10 PRECURSOR PULSE GENERATOR
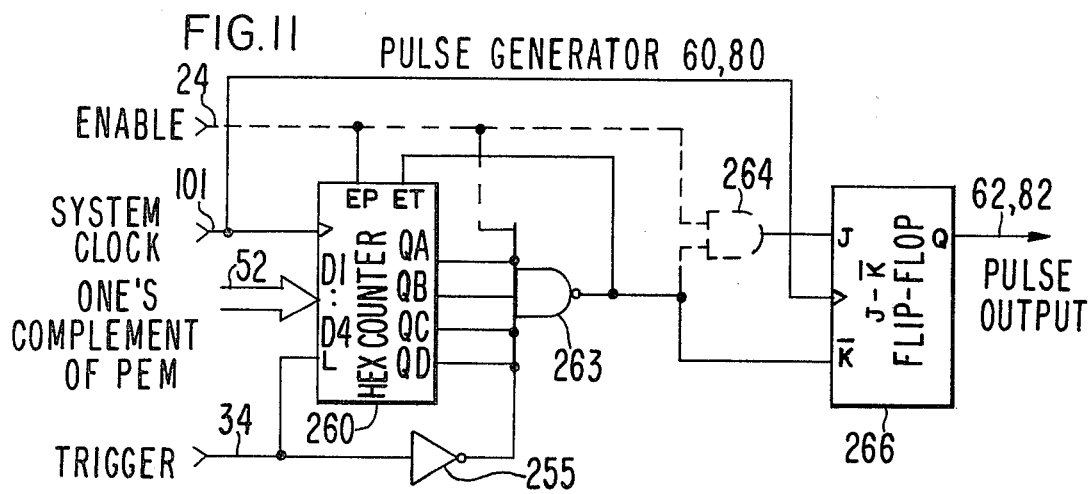
FIG.11 PULSE GENERATOR 60, 80

ADAPTIVE SWEEP BIT SYNCHRONIZER

BACKGROUND OF THE INVENTION

1. Field of the Invention

This invention is a system and set of circuits for regenerating a clock signal in response to random antipodal data, i.e., data having two voltage levels, over an arbitrarily wide range of bit rates. It has applicability in digital communications receivers.

2. Description of the Prior Art

U.S. Pat. No. 4,210,776 to VanMeter is a linear digital phase lock loop which cannot acquire or even operate significantly beyond the loop bandwidth, unlike the present invention which can acquire and operate throughout an arbitrarily wide frequency range. (Usually, the loop bandwidth is no more than 5% of the data rate because of noise considerations.) VanMeter is, however, a second order loop using a five bit adder, as in the present invention. VanMeter's circuit is entirely digital, e.g., he uses a digital frequency integrator, whereas the present invention contains analog circuitry, and thus is capable of a wider frequency operating range and more precise phase and frequency alignment. VanMeter does not state his circuit to be synchronous; the present invention operates synchronously.

U.S. Pat. No. 4,122,405 to Tietz is a PLL lock indicator. Tietz's pulse width discriminator 14 can work only at a fixed frequency because it has fixed values of R and C. His phase comparator 10 operates only for periodic not random data, whereas the present invention is operable for random data.

U.S. Pat. No. 3,646,452 to Horowitz is a PLL for self clocking data, i.e., there are at most three consecutive bits without a transition. On the other hand, the present invention operates on random data. Horowitz is suitable for magnetic recording, not for communications receivers as in the present invention.

Bellisio, "A New Phase-locked Timing Recovery Method for Digital Regenerators", IEEE 1976 Communications Conference proceedings, page 10-17 et seq., is a second order PLL which can operate and acquire over only a ±20% data rate range. Bellisio's approach is analog. On the other hand, the combination of digital circuits, frequency sweep, and lock decision gives the present invention an arbitrarily wide frequency range. The present invention use a binary counter for a phase detector, which is not present in Bellisio. Bellisio does not have the present invention's capability of determining when lock has occurred.

U.S. patent application Ser. No. 050,566, filed June 21, 1979, and commonly assigned with the present invention, is a second order phase lock loop. However, there is no provision for acquisition significantly beyond the loop bandwidth. Furthermore, this patent application does not provide for lock decisions as in the present invention.

U.S. Pat. No. 4,031,317 to McClain is a PLL intended for a single frequency. It tracks just phase, not frequency.

U.S. Pat. No. 3,781,695 to Jackson is a digital PLL which operates on periodic inputs only, not on random data.

U.S. Pat. No. 3,959,601 to Olevsky is a bit synchronizer which does not have any provision for acquisition. The circuit is very complex and expensive since it includes a frequency synthesizer, up and down converters, a 30 MHz bandpass filter, a variable time delay, etc. The data rate must be accurately programmed beforehand before the synchronizer can be operated. After the frequency has been programmed, frequency synthesizer tracking occurs in the vicinity of the loop bandwidth only. U.S. Pat. No. 4,019,153 to Cox is a first order PLL which operates on periodic inputs only.

All of the PLL circuits outlined above excepting Bellisio are intended to be used at a single data rate or at a countably finite number of data rates. They are not capable of multiple rate operation unless they are provided with several master oscillators or with a frequency synthesizer. Use of several oscillators is expensive and bulky. Even use of a frequency synthesizer requires that the data rate be known with good accuracy or requires careful manual or computer tuning.

The hybrid phase lock loop of the present invention is designed to operate at any data rate. The circuit is designed to rapidly acquire lock. The operator selects the appropriate half octave for the receive data rate. Alternatively, an autorange capability is provided to step the frequency by half octaves if the data rate is totally unknown. The circuitry for the range 3.75 Kbps to 480 Kbps has been built on a single 6"×17" circuit board and is relatively inexpensive.

None of the above circuits provides a capability for deciding when lock has been acquired, and an indication of same, as in the present invention.

SUMMARY OF THE INVENTION

The present invention is a hybrid bit synchronizer employing a second order phase lock loop (PLL) that is operable over an arbitrarily large number of octaves. It has a sweep capability and an autorange capability.

The phase detector 40 is a binary counter, which in the embodiment illustrated here has five bits. The most significant bit (MSB) within the counter is defined to be the recovered clock signal. This binary counter is clocked at 32 times the recovered clock frequency. The PLL is second order and is designed to force the falling edge of the MSB to align with the data transitions. The five bits within the binary counter divide the recovered clock period into 32 sections. At any instant, the number in the counter is a one's complement representation of the recovered clock's phase. Hence, this number can be recorded at the arrival of each data transition and used to determine the width and direction of phase and frequency correction pulses which feed the voltage controlled oscillator (VCO) 100 within the PLL. These pulse widths are determined by the four least significant bits (LSB's) within the binary counter. Directions of the pulses are determined by the sign of the MSB.

The data transition detector 30 receives the serial random antipodal data and triggers the pulse generators 60 and 80, sign latch 70, and lock decision circuit 110 when a data transition occurs, regardless of direction of the transition.

The two pulse generators 60 and 80 can be thought of as number controlled one-shots. When triggered, each issues a single pulse whose width is determined by the four bit code existing at its input at the time of triggering. Pulse generator 60 adjusts the phase of VCO 100 while the pulse generator 80 adjusts the frequency of VCO 100. The phase correction pulse generator 60 has a scaling input used to lengthen its output pulses as lower data rate octaves are selected such that a constant percentage loop bandwidth is obtained. Gating circuits 63 and 83 at the outputs of pulse generators 60 and 80, respectively, steer the pulses to up or down lines according to the sign of the phase error.

In the case of frequency correction pulse generator 80, an additional gate 84 is used to provide acquisition. When the loop is unlocked, gate 84 is selected by switch 85 and the frequency correction pulses are unconditionally steered to the frequency correction upline 88 (when sweeping upward), or downline 89 (when sweeping downward), regardless of the phase error sign. This creates a sweep whose rate automatically adjusts to the data rate and transition density. When the loop is locked, gate 83 is selected by switch 85 and the pulse direction becomes dependent upon the phase error sign. To determine when to switch from sweep to lock, lock decision counter 110 monitors the phase error at each transition. If a certain number (five in the illustrated embodiment) of consecutive transitions occur within the preselected "good" zone (phase error less than $\frac{1}{4}$ of the recovered clock period in the illustrated embodiment), switch 85 switches from sweep gate 84 to lock gate 83. If any transition occurs outside the "good" zone, the lock decision circuit 110 counter is reset and sweep is reinitiated after a delay controlled by lock release delay 120.

The phase and frequency correction pulses are summed and fed to the control input of VCO 100. The phase pulses are input directly while the frequency pulses are integrated first. This results in a second order PLL transfer function. The output of the integrator 90 is monitored by sweep direction control circuit 130 which reverses the sweep direction when the high or low end of the selected half octave is encountered.

VCO 100 is designed to operate over one octave with the half octave bit 11 determining whether the upper or lower half octave is covered. The octave and half octave are predetermined by the operator who programs scaling circuit 20 and half octave bit 11. Alternatively, an autorange circuit (FIG. 5) permits automatic scanning of all half octaves within the desired operating range of an arbitary number of octaves, and operates, until lock has been acquired.

BRIEF DESCRIPTION OF THE DRAWINGS

These and other more detailed and specific objects and features of the present invention are more fully disclosed in the following specification, reference being had to the accompanying drawings, in which:

FIG. 3 is a timing diagram of the bit synchronizer of the present invention operating in lock mode when octave N=2;

FIG. 4 is a timing diagram of the bit synchronizer of the present invention in sweep mode for any octave N;

FIG. 5 is a circuit diagram of the autorange feature of the present invention;

FIG. 6 is a circuit diagram of scaling circuit 20 of the present invention;

FIG. 7 is a circuit diagram of phase detector 40 of the present invention;

FIG. 8 is a circuit diagram of transition detector 30 of the present invention illustrating a 3/16 period lockout;

FIG. 9 is a circuit diagram of one's complement decoder 50 of the present invention;

FIG. 10 is a circuit diagram of the precursors of pulse generators 60 and 80 of the present invention;

FIG. 11 is a circuit diagram of pulse generators 60 and 80 of the present invention;

DESCRIPTION OF THE PREFERRED EMBODIMENTS

Figure 1:
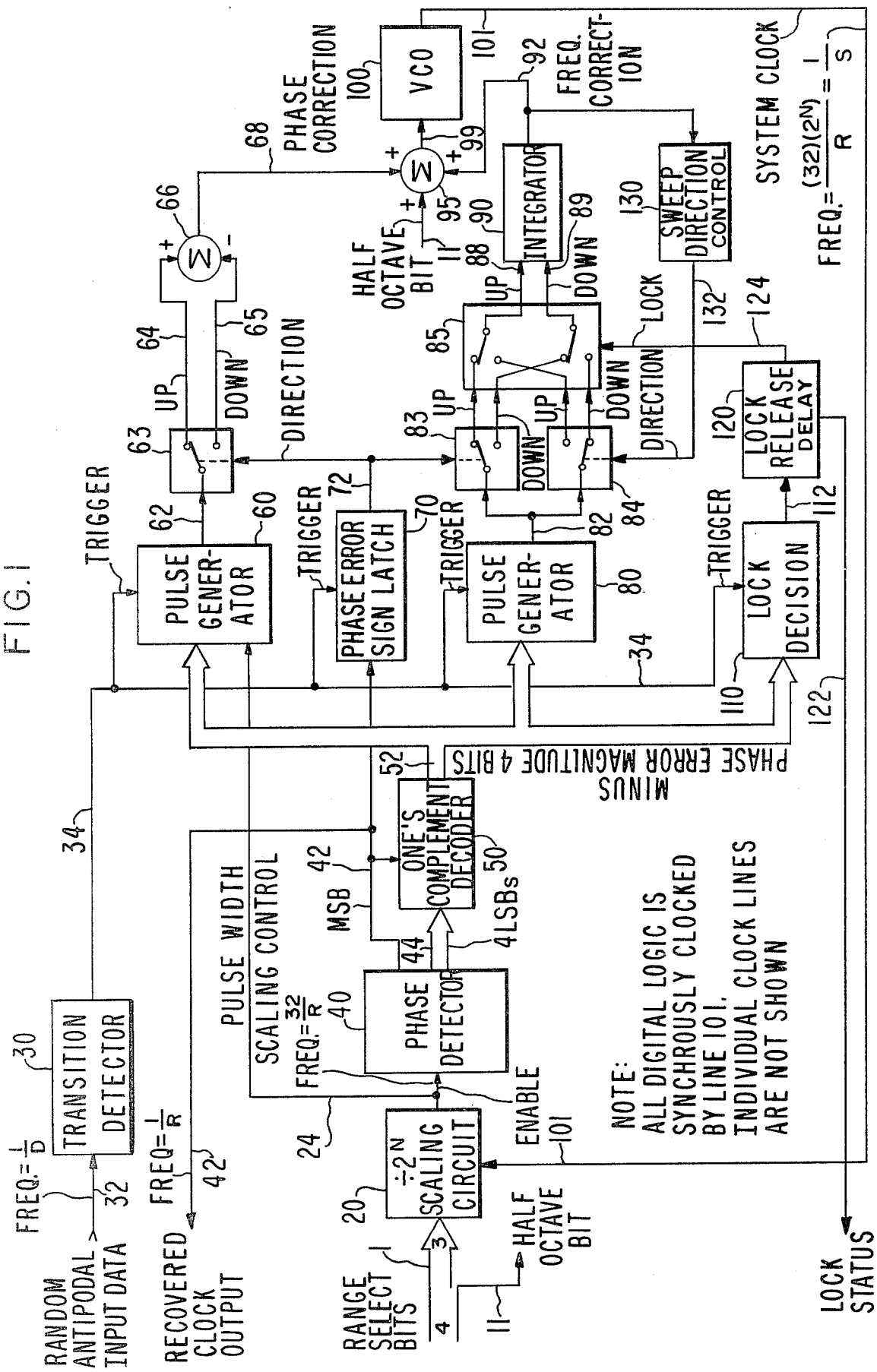
FIG. 1 is a block diagram of the bit synchronizer of the present invention.
Figure 2:
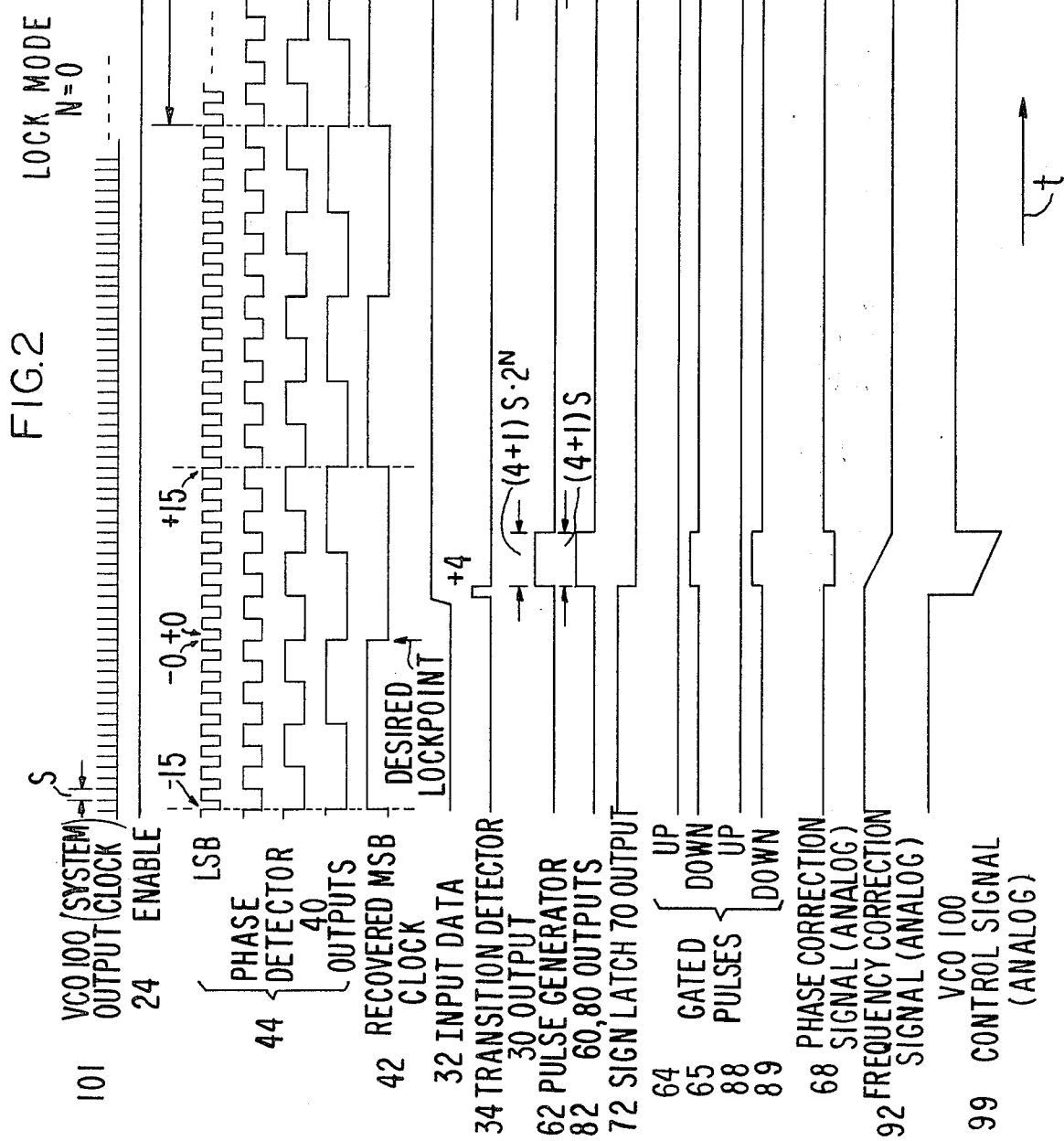
FIG. 2 is a timing diagram for the bit synchronizer of the present invention in lock mode for octave N=0.

The overall system performance may be understood by examining FIG. 1 in conjunction with FIGS. 2, 3, and 4. The input data is any random antipodal input data and is applied over line 32. "Antipodal" means that the data can have one of two states, a high voltage level representing a logical one, or a low voltage level representing a logical zero. The bit period of the input data is D so that the frequency of this data is 1/D. The data is applied to transition detector 30 which produces a positive trigger pulse of duration S (the system clock period) for each transition of the data, whether from high to low or from low to high. It is assumed that the input data has been squared off by a comparator if required. The system clock operates at a frequency of $1/S = (32)2^N/R$ where N is an integer representing the frequency octave and R is the period of the recovered clock. The trigger pulse is applied along line 34 to pulse generator 60, which generates a pulse related to phase deviations; to phase error sign latch 70; to pulse generator 80, which generates a pulse related to frequency deviations; and to lock decision counter 110.

In the nonsweeping (lock) mode, the system approximates a proportional-integral control (second order) PLL as evidenced by the phase correction portion and the frequency correction portion. The loop filter transfer function is given by $$F(s) = \frac{\Delta f}{\theta e} = \frac{K(s + a)}{s} = K + \frac{Ka}{s}$$

where $\Delta f$ is the frequency change of VCO 100, $\theta e$ is the phase error, K and a are constants determining the closed loop bandwidth and damping factor, and s is the usual Laplace transform variable. The rightmost term of the equality clearly shows the proportional and integral terms.

Use of separate pulse generators 60 and 80 allows a constant percentage loop bandwidth to be maintained when switching octaves of data frequency. This is achieved by lengthening the phase pulses as lower octaves are selected. Furthermore, swept acquisition is implemented by diverting frequency pulses without affecting phase pulses.

Referring to FIGS. 1 and 2, phase errors between the input data 32 and the recovered clock 42 are measured by phase detector 40 which is a binary counter (having five bits in the embodiment illustrated, i.e., it is a modulo 32 counter) operating at a frequency of 32/R. The output of phase detector 40 is a set of five bits, four least significant bits (LSB's) 44 and a most significant bit (MSB) 42. MSB 42 is defined to be the recovered clock, which operates at a frequency of 1/R. The five bits divide the input clock period into 32 equal sections. The falling edge of MSB 42 is defined to be zero phase reference (i.e., a transition at the falling edge of MSB corresponds to zero phase error). By this technique, the number in phase detector 40 at any given time is the one's complement representation of the recovered clock's phase. This number, at the arrival of a data transition, represents the phase error between the data and MSB 42.

FIG. 2 shows three transitions of the input data 32 and further shows the first transition occurring four system clock periods following the desired lockpoint, i.e., the phase error (PE) is +4. The second transition occurs two S periods prior to the desired lockpoint, and therefore, its PE is −2; and the third transition occurs within one S period just after the desired lockpoint, and therefore is assigned a PE of +0 by phase detector 40. There are $2^5 = 32$ possible values of PE, as illustrated by phase detector 40's outputs in FIG. 2.

One's complement decoder 50 converts PE into the negative of the absolute value of the phase error (i.e., minus the phase error magnitude (PEM)). The negative sign is required by the circuit technique used to implement the pulse generators 60, 80 in the illustrated embodiment. Minus PEM, comprising four bits, is fed along bus 52 to pulse generator 60, pulse generator 80, and lock decision counter 110. Pulse generators 60 and 80 are designed to deliver non-zero durations even for counts of PE = +0 or PE = −0. With this approach, counter resolution does not cause significant clock jitter unless the data has a DC offset and a slow rise time, in which case a peak-to-peak jitter of up to 3.1% of the clock period may result.

Whenever a trigger pulse 34 occurs, pulse generator 60 is made to output onto line 62 a pulse whose width is equal to $2^N(\text{PEM}+1)S$. Similarly, pulse generator 80 produces a pulse of width (PEM+1) S on its output line 82 which is fed to switches 83 and 84. The sign of the PE is determined solely by MSB 42 and is fed to phase error sign latch 70, which conveys the sign information over line 72 to switches 63 and 83. If the sign of the PE is positive, line 72 instructs switches 63 and 83 to connect their input lines to their "down" output lines. Similarly, if the sign of the PE is negative, line 72 instructs switches 63 and 83 to connect their inputs to their "up" output lines.

Switch 85 is a double-pole double-throw switch (e.g., a dual 2 line to 1 line multiplexer) which switches gate 83 into the circuit when the system is operating in the lock mode, i.e., acquisition has been accomplished (illustrated in FIGS. 2 and 3) or gate 84 into the circuit during the sweep mode (illustrated in FIG. 4). Gates 63, 83, and 84 can be one-line to two-line demultiplexers.

Summer 66 inverts the polarity of pulses coming into it on down line 65 while not inverting pulses coming into it on up line 64, thus producing phase correction pulse 68. Integrator 90 integrates the pulses entering it over lines 88 and 89; its output 92 ramping upward during pulses coming in on "up" line 88 and downward during pulses coming in over "down" line 89. The steepness of the ramp is pre-established by the chosen loop bandwidth. Phase correction signal 68 and frequency correction signal 92 are applied via summer 95 and line 99 to VCO 100. The pulseform diagrams on FIGS. 2 and 3 show the signals on line 99 with a scaling factor applied to the phase pulse. The frequency of output clock 101 of VCO 100 is proportional to the voltage on line 99. A decreasing voltage on line 99 decreases the output frequency of VCO 100 (which is system clock 101) and a rising voltage on line 99 increases the system clock 101. Clock 101 is fed to all digital logic to achieve logic synchronization, although for purposes of simplifying FIG. 1, most of these connections are not shown.

The integration coefficient of integrator 90 determines the slope of the waveform produced on line 92 by integrator 90. Together, the phase pulse height and integration coefficient determine the damping factor and the loop bandwidth of the PLL. Typical nominal values of damping factor and loop bandwidth employed in digital communications receivers are 1.0 and 0.5%, respectively.

Referring now to FIG. 1, system clock 101 is also fed to scaling circuit 20, a divide by $2^N$ counter which determines the octave N that is being operated in by the system. The highest octave (illustrated in FIG. 2) corresponds to N=0, the next highest octave is N=1, etc. The value for N is fed into the system by range select bits coming in over bus 1. The embodiment illustrated shows 4 range select bits but other values may be chosen. One of these bits determines the half octave and is fed via line 11 to summer 95. This bit selects the high or low portion of the octave. Limiting operation of each range to less than one full octave precludes problems of locking onto a harmonic of the data rate. The other three range select bits determine the value of the octave N and are fed into scaling circuit 20. The range select bits may be fed in manually by the operator of the bit synchronizer, or may be scanned automatically by means of the autorange feature of the invention to be described later. In autorange, harmonic lockup problems are minimized by beginning the autorange in the lowest half octave and proceeding monotonically upward through the half octaves.

Referring now to FIGS. 1 and 3, the output of scaling circuit 20 is enable line 24 having pulses of duration S at a frequency of 32 times the recovered data rate. Enable line 24 is fed as an input to phase detector 40 and as a pulsewidth scaling control to pulse generator 60. Enable line 24 serves to slow down the operation of phase detector 40 and pulse generator 60 by a factor of $2^N$, thereby making the speed of this portion of the system commensurate with the data rate of the input data. An additional output of scaling circuit 20 is early enable line 22 which is fed as an input to transition detector 30. This line is not shown on FIG. 1 for purposes of simplicity.

Examining FIG. 3 and comparing it with FIG. 2, we note that FIG. 2 is for the case where the octave number N=0 and FIG. 3 is for the case where N=2.

For a general N, enable line 24 is on for a period of S and then is off for a period of $(2^N-1)(S)$. Thus, for the case illustrated where N=2, enable 24 is on S, off 3S, on S, off 3S, etc. The pulses on lines 44 and 42 are slowed down by a factor of 4.

FIG. 3 illustrates a single transition in the input data occuring at a PE=−4. Trigger 34 is generated synchronously with the first pulse from enable 24 after the transition.

Note that the factor of $2^N$ is not applied to the pulses on line 82 in order to maintain a constant percent loop bandwidth when switching octaves.

Refer now to FIGS. 1 and 4. Before the bit synchronizer becomes locked it operates in its sweep (acquisition) mode. In sweep mode, DPDT switch 85 connects gate 84 to integrator 90. Sweep is achieved by unconditionally gating the frequency correction pulses to the up line (as illustrated in FIG. 4) or down line 89 based upon the status of sweep direction control 130 and not the sign of the PE. The frequency is swept unidirectionally across the entire half octave or until lock occurs, and reverses direction when the half octave endpoints are encountered. Since frequency correction pulses are issued when and only when transitions of input data occur, the sweep rate automatically adapts to the data rate and to the transition density. When the frequency error is outside the loop bandwidth, the frequency correction pulses are of random length. When the frequency error falls within the loop bandwidth, the average pulse length decreases and hence, the sweep rate decreases. Thus, there is no overshoot caused by the sweep.

To determine if lockup has occurred, lock decision circuit 110 monitors PEM at each transition. If a sufficient preselected number of transitions (5 for a noise bandwidth of 1%) in the "good" region (defined as PEM≦7 in the illustrated embodiment, which is a period of R/2) occur consecutively, a "lock" signal is outputted on line 112 and on line 124 instructing switch 85 that lock has occurred and that gate 83 should now be switched into the system. If, on the other hand, any transition occurs outside the "good" region, counter 310 within lock decision circuit 110 is reset and line 112 indicates "unlock". To provide improved holding properties in a noisy environment, lock release delay 120 contains an RC circuit which is ORed with the basic lock signal 112 to become lock signal 124. Thus lock signal 124's attack is instantaneous and 124's release is delayed. Additionally, delay 120 provides an output on line 122 indicating whether lock has occurred, which can provide for a visual indication to the operator.

The requirement for lockup ("good" zone≦R/2) given above is necessary to prevent false locking. False lock could otherwise occur whenever R/D=m/n where m and n are integers. Note that bit synchronizers intended for a single known data rate such as those of the prior art discussed above have a m/n very close to 1. The frequency discrepancy then falls within the neighborhood of the loop bandwidth, and the false lock point is too week to hold.

In FIG. 2, VCO 100 output 101 is shown by just the rising transitions of the squarewave. S is the bit period of system clock 101. For the TTL logic of the illustrated embodiment, S is greater than about 50 nanoseconds. Note that for the case N=0 illustrated in FIG. 2, enable line 24 is always high.

All the circuits triggered by line 34 trigger on the first pulse from system clock 101 after line 34 goes high.

The operator can obtain an approximation of the data rate by using a spectrum analyzer prior to demodulation or an oscilloscope after demodulation. The autorange feature of the invention enables one to eliminate the spectrum analyzer and the oscilloscope.

FIG. 4 illustrates the timing relationships in the invention in the sweep mode for any N. The sweep circuit sweeps across one half octave at a time. In the illustrated embodiment, the "good" zone is defined as PEM being less than or equal to 7. This results in 16 good S regions and 16 bad S regions for each transition. Of course, one skilled in the art could establish other "good" zones.

For purposes of illustration only, the input data is shown as having a repetitive 1 0 1 0 pattern; the system will operate on any random antipodal data with transition density greater than about ten percent.

The recovered clock 42 starts off too slow. The phase detector 40 contents illustrate the PE at each transition. It is seen that the recovered clock begins to catch up with the input data because of the phase correction signal 68 and the frequency correction signal 92 applied to VCO 100. When the contents of lock decision counter 110 first equal five, lock has been achieved and lock signal 124 goes high. The system can be easily designed so that a number other than 5 consecutive good transitions is defined as a lock.

During the sweep mode, phase correction signal 68 operates as if it were in the lock mode. However, frequency correction signal 92 operates differently in that the voltage on line 92 changes in the same direction for all transitions regardless of the contents of MSB 42. This direction is governed by sweep direction control 130 which changes direction only when the end point of the half octave has been reached.

The sweep rate is a function of the transition rate of the input data. This has two advantages. First, it prevents overrunning, i.e., if the sweep rate were faster than the transition rate a lock could be missed. Secondly, it permits fast locking at high data rates; this is particularly important when using the autorange feature of the invention.

FIG. 5 is a circuit diagram of the autorange feature of the invention. The illustrated embodiment incorporates seven octaves corresponding to N=0 through N=6. However, one could easily adapt the circuit for additional octave ranges if need be. Four range select bits, which are sufficient to give information concerning which octave is desired, whether autorange is in operation, and which half octave within the octave is employed, are fed via bus 9 into latch 2, a four bit latch that latches upon a positive pulse appearing at its strobe input. The operator sends a signal over the strobe line when he wishes the range select bits to be latched. Latch 2 can be a 74LS75.

The latched bits are fed to data selector 4, a quad 2 to 1 multiplexer such as a 74LS157, and to NOR gate 10, the output of which is a 1 only when all four inputs are 0 (indicating autorange in the illustrated embodiment). If autorange is not selected, selector 4 feeds through the four input bits from latch 2 to its output, three of the bits going on bus 1 to scaling circuit 20 and a fourth bit, the least significant bit, going on line 11 and denoting the octave half.

If data selector 4 has been informed by NOR gate 10 (which controls its select input) that the autorange feature has been selected, selector 4 passes to its output the four bits reaching it from hex counter 6. Hex counter 6, which can be a 74LS161, is the autorange counter. It increments every time sweep direction control 130 changes from up to down. The signal 132 from control 130 is applied to the clock input of counter 6 via line 132 and inverter 12. To prevent false locks and speed up acquisition in the autorange mode, the output of NOR gate 10 disables the lockout feature of the transition detector (FIG. 8).

An additional piece of circuitry is that the output of NOR gate 10 and the strobe line are NANDed together by NAND gate 8, the output of which is fed to point D within sweep direction control 130 (see FIG. 13) and, following inversion, to the clear input of counter 6. The purpose of this is to make sure that the lowest half octave is completely covered by forcing the initial sweeping to sweep downwards is frequency. Since the output of NAND gate 8 is a 0 only when both the inputs are 1's, it clears counter 6 only upon the simultaneous occurrence of a strobe and an autorange indication.

FIG. 6 is a circuit diagram of scaling circuit 20. A coding is employed to convert between the range select bits coming in over bus 1 and the value of N. For the illustrated circuit, this conversion code is as follows:

| Value of N | Range Select Bits |
|---|---|
| 0 | 111 |
| 1 | 110 |
| 2 | 101 |
| 3 | 100 |
| 4 | 011 |
| 5 | 010 |
| 6 | 001 |

The three most significant range select bits are fed to code converter circuit 220, a network of AND gates 201, 202, 203, 204, and OR gates 205, 206, and 207 connected as shown in FIG. 6. The fourth bit is fed on line 11 to summer 95. The six output bits from code converter 220 are fed to counter logic 222. Four of the bits are the four data inputs (D2 through D4) to hex counter 223 (which can be a 74S163) and two of the bits are fed as the two least significant data inputs (D1 and D2) to hex counter 225 (which can also be a 74S163). The two most significant data bits (D3 and D4) of counter 225 are forced to be logical 1's. The carry out output of counter 223 is connected to the enable input of counter 225. This results in a combined counter with a capacity of 256. Carry out of 223 is high when all the data stores within counter 223 are logical 1's.

System clock 101 is fed to the clock inputs of counters 223 and 225, and is also the clock for D flip-flop 229 (which can be a 74S74). The $\overline{Q}$ output of flip-flop 229 is enable line 24. The purpose of flip-flop 229 is to deglitch line 228 and enhance the speed of the logic system. The signal applied to the D input of flip-flop 229 is the carry out output of counter 225 after undergoing inversion by inverter 227. This latter signal, coming in on line 228, is inverted before being applied to each of the load inputs of counters 223 and 225. The carry out output of 225 becomes early enable line 22 which is fed to transition detector 30. It is always one S period earlier than enable line 24, but these two pulses have the same duration, S.

The circuit works as follows. Since we want to make a delay equal to $(2^N-1)S$ we load combined counter 223, 225 at $256-2^N$. Then the time it takes for the combines counter to reach 255 gives the requisite $(2^N-1)S$ delay. The one's complement of the binary representation of $2^N-1$ is the number fed to the data inputs of combined counter 223, 225 with D1 of 223 as the least significant bit.

FIG. 7 is a circuit diagram of phase detector 40. Enable 24 is fed as the enable input of counter 242, a hex counter (four binary bits) such as a 74S163. Counter 242 and JK flip-flop 244 (which can be a 74S112 with an inverter on its clock input) are clocked by system clock 101. The purpose of JK flip-flop 244 is to extend the four bits of counter 45 so that phase detector 40 has a five bit capacity. This is accomplished by connecting the carry out output of counter 242 to the J and the K inputs of flip-flop 244. With this connection, the QA, QB, QC, and QD outputs of counter 244 become the four least significant bits 44 and the Q output of flip-flop 244 becomes MSB 42.

FIG. 8 is a circuit diagram of transition detector 30. System clock 101 clocks D flip-flop 237 (which can be a 74S74) and hex counter 238 (which can be a 74LS161). D flip-flop 234 (which can also be a 74S74) is clocked by line 233 containing brief pulses occurring upon each data transition. The width of each pulse is equal to the delay imparted by exclusive-OR gate 231, and must be greater than the minimum clock pulse width of flip-flop 234. If this delay is too short, several exclusive-OR gates can be wired together in series in lieu of a single exclusive-OR 231. The input data on line 32 is applied as one input to exclusive-OR gate 231, the other input of which is forced to be 0. Thus the output of gate 231 will be a 1 only when the data input is a 1. The output of gate 231 is fed as one input to exclusive-OR gate 232, the other input of which is connected to data line 32. Wiring the exclusive OR gates in this fashion results in a spike (sketched on line 233) produced for each data transition of the input data. The spike is always positive regardless of the direction of the data transition. Exclusive-OR gate 231 typically provides a spike pulse width of approximately 15 nanoseconds.

Early enable on line 22 is fed as one input to NAND gate 236, the other input of which is connected to the $\overline{Q}$ output of flip-flop 234. The output of gate 236 is fed as the D input to flip-flop 237, the Q output of which is connected after inversion to the preset input of flip-flop 234 and the clear input of counter 238. By this connection, flip-flop 234's $\overline{Q}$ is reset to 0 at the beginning edge of each trigger pulse to prepare for the next data input transition.

Counter 238 acts as a lock out device when autorange is not in operation. In this case 6/32 (3/16) of the R period is locked out, i.e., multiple transitions occurring within the lockout period result in only one trigger. This serves to attenuate the spurious transitions that often occur on noisy channels. Counter 238 is jointly enabled by its EP and ET terminals, the former being connected to enable 24 and the latter being connected to the output of NAND gate 239. The two inputs of NAND gate 239 are connected to the QB and QC outputs of counter 238. Since counter 238 is jointly enabled, both enables have to be logical 1's in order for the counter to increment. When QB and QC are both 1's (representing decimal 6, giving the desired (6/32)R lockout time) a logical 0 is outputted by gate 239 until such time as counter 238 is cleared. When 238 is in its counting (lockout) mode prior to a count of decimal 6 the output of gate 239 is a logical 1. During this time, flip-flop 234 clocks 0's to its $\overline{Q}$ output, thus closing gate 236 during this time. Other lockout periods can be used by connecting others of counter 238's outputs to gate 239. AND gate 235 (with one input inverted) serves to disable the lockout feature when autoranging is in effect; i.e., when a logic 1 appears at its input labled "Lockout Disable".

FIG. 9 is a circuit diagram of one's complement decoder 50.

MSB 42 is fed via inverter 251 to one input of each of exclusive-OR gates 252, 253, 254, and 255. The four least significant bits 44 are fed respectively to a second input of each of exclusive-OR gates 252, 253, 254, and 255. The outputs of these four exclusive-OR gates go out on bus 52 as minus PEM. All bits get inverted when the MSB is low, i.e., when PE is positive. (PEM itself is not used because bus 52 is fed into up counters 60 and 80, not down counters). The circuitry serves to invert all bits when MSB 42 is low, i.e., when PE is positive.

FIG. 10 is a circuit diagram of the precursors to pulse generators 60 and 80. Enable line 24, fed to the EP input of hex counter 260 (which can be a 74LS163) is shown as a dotted line because it does not exist for frequency correction pulse generator 80 but does exist for phase correction pulse generator 60. Counter 260 is clocked by systems clock 101 and is dual enabled by EP and ET, the latter being connected to the output of inverter 262, the input of which is connected to the carry out output of counter 260.

Bus 52 feeds the four data inputs (D1 through D4) to counter 260, which is loaded upon the occurrence of a trigger pulse at its load input. It is only during the counting period (defined by the time it takes for the counter to reach 15) that carry out is a logical 0, and therefore the output of inverter 262 is high. The length of this pulse is therefore PEM.S for frequency correction pulse generator 80, and $2^N$.PEM.S for phase correction pulse generator 60.

FIG. 11 shows how the additional duration of one enabled clock period is added to the pulses produced by the circuits of FIG. 10. The circuit is similar to that depicted in FIG. 10, with the deletion of inverter 262 and the addition of inverter 255, NAND gate 263, AND gate 264, and J-$\overline{\text{K}}$ flip-flop 266 (which can be a 74LS109). Flip-flop 266 serves to delay the pulse one enabled clock period. Once again, enable line 24 is dotted and AND gate 264 is dotted to indicate that these items are not present for frequency correction pulse generator 80, but are present for phase correction pulse generator 60. The connection of all four data outputs (QA, QB, QC, and QD) of hex counter 260 as inputs to NAND gate 263 is equivalent to the FIG. 10 connection of the carry out output of counter 260 to the input of inverter 262. FIG. 11, however, adds a line from trigger 34 via inverter 255 as an additional input to NAND gate 263. This additional line serves to fill in the first enabled clock period which would otherwise be zero due to reclocking by flip-flop 266.

Enable 24, when present, is also connected as an input to NAND gate 263. System clock 101 drives the clocks of flip-flop 266 and counter 260. To achieve reclocking, enable 24 and the output of NAND gate 263 are ANDed into the J terminal of flip-flop 266, and the output of NAND gate 263 is fed to the $\overline{\text{K}}$ terminal of flip-flop 266, and to the ET terminal of counter 260 as in FIG. 10. The Q output of flip-flop 266 provides the pulses of the desired duration.

Figure 12:
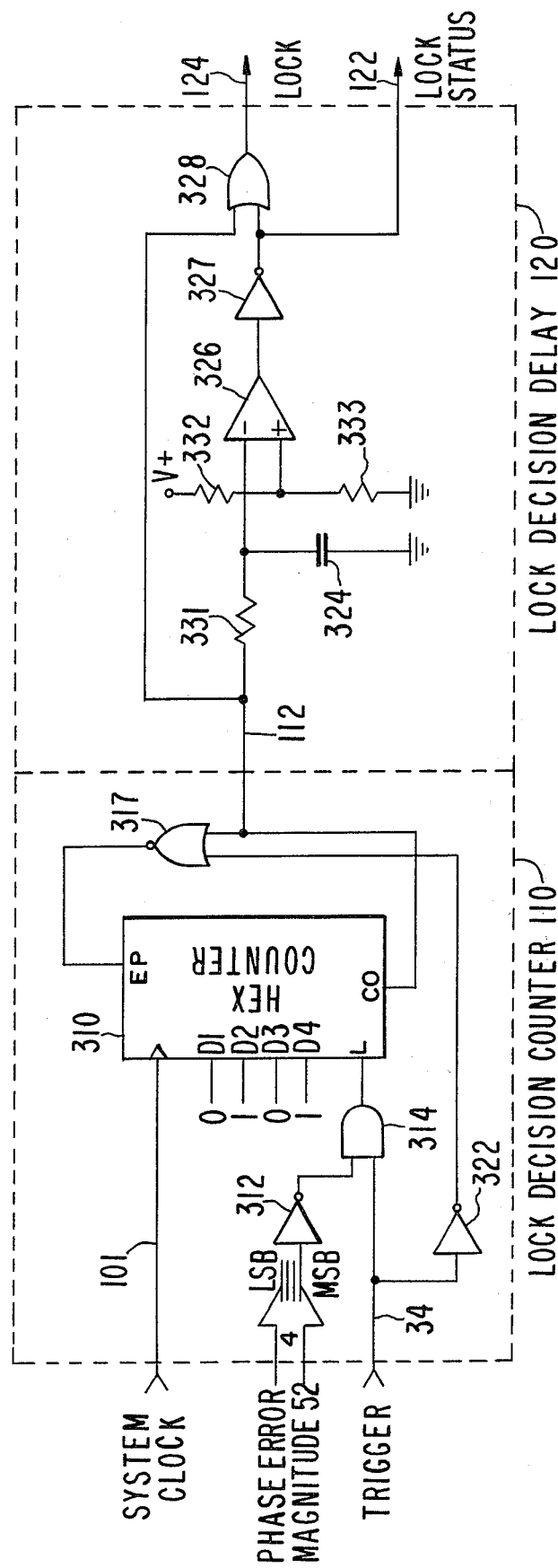
FIG. 12 is a circuit diagram of the lock decision circuits of the present invention.

FIG. 12 illustrates the lock decision circuitry that operates during sweep mode. Minus the PEM is fed as an input to lock decision circuit 110 via bus 52. Only the most significant bit of these four bits is used in the illustrated embodiment, but other bits might be used in other embodiments. The input bit is fed via inverter 312 and AND gate 314 to the load input of hex counter 310, which can be a 74LS163.

The D4 through D1 inputs of counter 310 are forced to be 1 0 1 0 (decimal 10) so that it takes five counts for counter 310 to reach capacity, since in the embodiment illustrated, the lock criterion is five consecutive good transitions. System clock 101 clocks counter 310.

Trigger 34 is fed as a second input to AND gate 314 and via inverter 322 to a first input or NOR gate 317, the second input of which is connected to the carry out output of counter 310. The carry out output of counter 310 is also fed over line 112 to lock decision delay circuit 120. The output of NOR gate 317 is fed to the EP enable connection of counter 310.

Line 112 is fed to one input of OR gate 328 and via resistor 331 to the inverting terminal of comparator 326, which terminal is also connected via capacitor 324 and ground. The positive terminal of comparator 326 is connected via resistor 332 to V+ and via resistor 333 to ground. The output of comparator 326 is also connected via inverter 327 to a second input of OR gate 328. The second input of OR gate 328 is also lock status line 122. The output of OR gate 328 is lock line 124.

For a "good" zone of ±R/4 from the desired transition point, a most significant bit on bus 52 of 1 indicates that the transition was good. This can be verified by examining the sixth waveform on FIG. 2 and remembering that one's compliment decoder 50 inverts waveforms only when MSB 42 at its input is 0. Counter 310 does not increment unless trigger 34 is a 1 because when trigger 34 is a 0 its contribution to the input of NOR gate 317 is a 1, therefore the output of NOR gate 317 is a 0.

It is seen that a 0 at the carry out output of counter 310 indicates unlock. Any bad transition will accomplish this because both inputs to AND gate 314 will be 1's thereby causing counter 310 to load, forcing its contents to be decimal 10 and its carry out output to be 0.

It will then take five consecutive good transitions for CO to reach 1, at which time it will cease counting because of the connection of CO to EP through NOR gate 317.

Since 112 is directly connected to an input of OR gate 328, a lock indication on 112 is immediately transmitted as a lock condition on line 124. The rest of lock decision delay circuit 120 has been designed to prevent spurious unlocking. It permits the unlocking of the system only when line 112 has been giving an unlock (zero) signal for a period of time called the discharge time or the release time. Resistor 331 and capacitor 324 determine the release time. For a release time of 100 milliseconds, the value of resistor 331 is 10,000 ohms and the value of capacitor 324 is approximately 5 microfarads. Since it takes a while for capacitor 324 to charge up upon a 1 coming along line 112, there is a charge period of approximately 500 milliseconds during which the spurious unlocking inhibiting feature is inoperative. This slow charge time is incorporated to prevent false locking. Resistors 332 and 333 determine the ratio between this charge period and the release period.

Figure 13:
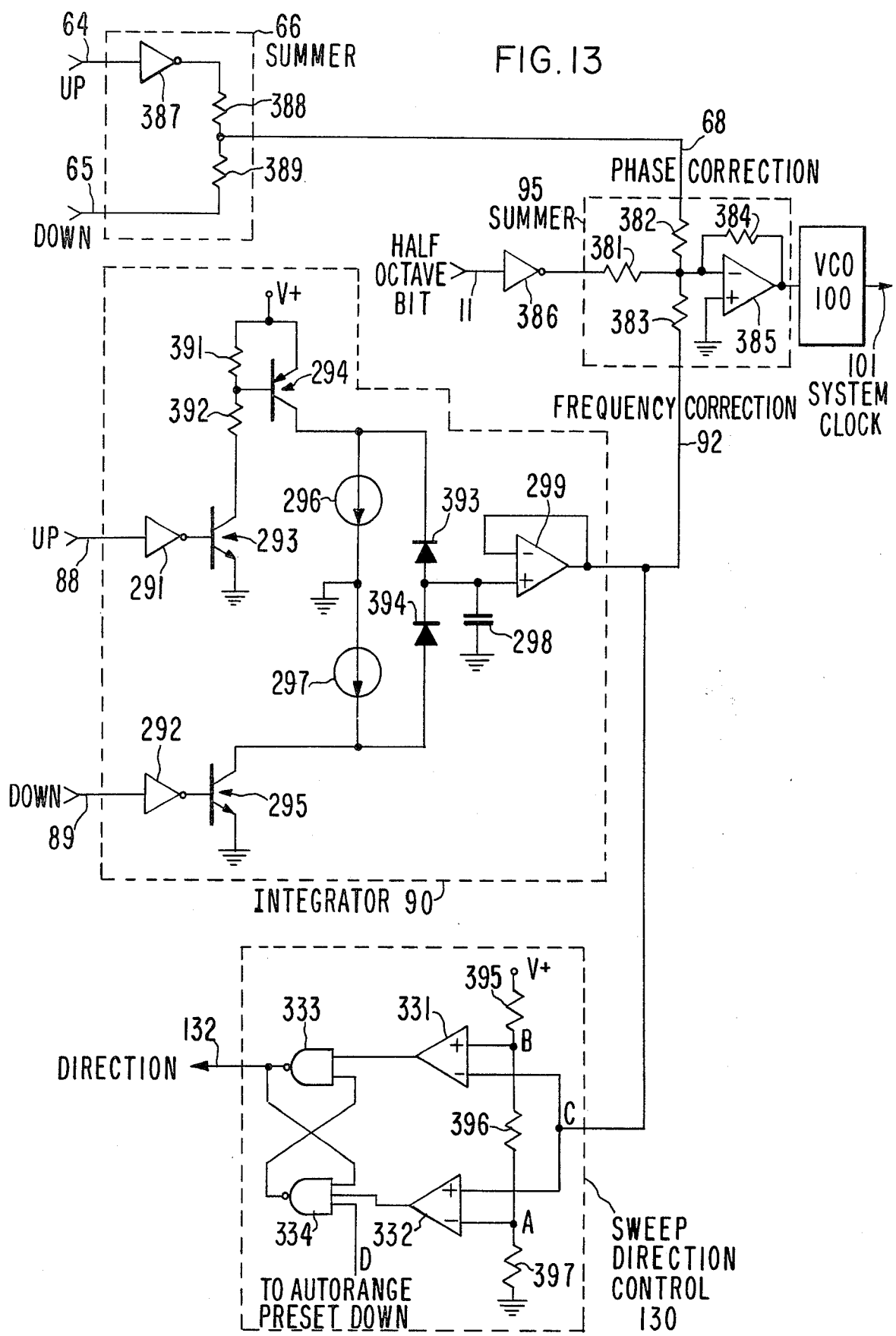
FIG. 13 is a circuit diagram of the VCO, summers, integrator, and sweep direction circuitry of the present invention.

FIG. 13 illustrates the remaining circuits of the system. Summer 66 comprises inverter 387 and summing resistors 388 and 389, which have the same value and must be much smaller in value than scaling resistor 382. Up line 64 rather than down line 65 is inverted because op amp 385 within summer 95 also acts to invert the signs of all signals. This is also the reason line 11 is inverted by inverter 386 before being fed via its scaling resistor 381 to the inverting terminal of op amp 385. A 0 on line 11 indicates the lower half octave and a 1 indicates the upper half octave.

Op amp 385, having its noninverting input grounded and having resistor 384 connected between its inverting input and its output, inverts and sums the signals applied to its inverting input. Its output is fed as the input to VCO 100, a highly linear voltage controlled multivibrator such as a Fairchild 11C58 with ECL to TTL conversion on its output. The output of VCO 100 is system clock 101. Resistors 381, 382 and 383 are scaling resistors which set the frequency operating range, loop bandwidth, and damping factor.

Integrator 90 works as follows: a 1 on downline 89 is inverted by inverter 292, thus shutting off NPN transistor 295. This causes current source 297 to charge up capacitor 298. This voltage across 298 is reflected to the output of 299 and is later scaled and inverted by op amp 385. A 0 on downline 89 causes transistor 295 to short, thus reverse biasing diode 394 because the voltage at the noninverting input of op amp 299 is above ground potential.

Similarly, a logical 0 on upline 88 causes NPN transistor 293 to short, causing PNP transistor 294 to short to V+, reverse biasing diode 393 because the positive input of op amp 299 is between 0 and V+ volts due to the voltage levels on the output of op amp 299. A logical 1 on upline 88 causes transistors 293 and 294 to shut off, allowing current source 296 to discharge capacitor 298; this change in voltage is reflected to the output of 299 and scaled and inverted by summer 95.

Sweep direction control circuit 130 contains three way voltage divider 395, 396, and 397; comparators 331 and 332; and an SR latch consisting of NAND gates 333 and 334. When both inputs to the latch are 1, the output is held steady. If the output of comparator 332 becomes a 0, the output of NAND gate 334 becomes a 1 if it wasn't already. Similarly, if the output of comparator 331 becomes a 0, the output of NAND gate 333 becomes a 1 if it wasn't already.

If the voltage at point C is between the voltage at A and the voltage at B, the outputs of both comparators 331 and 332 are 1's. If the frequency of VCO 100 is rising then the voltage at point C is falling because of the action of inversion caused by op amp 385. When the voltage at C falls to less than the voltage at A, the output of comparator 332 becomes a 0, direction 132 becomes a 0, and the swept frequency starts dropping.

Similarly, when the output frequency of VCO 100 is falling the voltage at point C is rising. When the voltage at C exceeds the voltage at point B, the output of comparator 331 becomes a 0. This causes direction 132 to go high, thus causing the swept frequency to start rising.

When resistors 395, 396 and 397 are equal in value, the voltage at point B is $\frac{2}{3}$ V+ and the voltage at point A is $\frac{1}{3}$ V+.

Point D of NAND gate 334 is used by the autorange circuitry (FIG. 5) to preset the sweep direction to "down" as previously discussed.

The above description is included to illustrate the operation of the preferred embodiments, and is not meant to limit the scope the invention. The scope of the invention is to be limited only by the following claims. From the above discussion, many variations will be apparent to one skilled in the art that would yet be encompassed by the spirit and scope of the invention. For example, if greater speed is desired, integrated circuits other than TTL can be employed.

What is claimed is:

1. A bit synchronizer for generating a recovered clock output in synchronization with an input data stream containing random antipodal data, comprising:

phase detector means for measuring phase differentials between transitions within said input data stream and said recovered clock, said detector means having a first input coupled to the input data bit stream, and two outputs, i.e., a phase error signal and the recovered clock;

means for monotonically varying the frequency of said recovered clock over a preselected range prior to synchronization, said varying means having a first input coupled to the phase error signal and an output coupled to a second input of the phase detector means; and means for deciding when said input data stream and said recovered clock are in synchronization, said deciding means having a first input coupled to the input data stream, a second input coupled to the phase error signal, and an output coupled to a second input of the varying means;

wherein the varying means has a third input coupled to the input data stream, and the rate of varying the frequency of the recovered clock depends upon the data rate and transition density of the input data stream.

2. Apparatus of claim 1 wherein said varying means comprises a voltage controlled oscillator (VCO) having a system clock output having a frequency proportional to the frequency of the recovered clock, wherein the system clock frequency systematically sweeps over the preselected frequency range when the recovered clock and the input data stream are not in synchronization;

wherein the system clock is coupled to the second input of the phase detector means;

wherein the system clock frequency is proportional to the frequency of the input data stream when the recovered clock and the input data stream are in synchronization;

wherein the rate of varying the frequency of the recovered clock depends upon said phase differentials.

3. Apparatus of claim 2 wherein said deciding means comprises:

a transition detector having an input coupled to the input data stream, said transition detector generating trigger pulses in response to data transitions on the input data stream;

means for dividing each recovered clock bit period into a preselected lock region and a preselected mutually exclusive and exhaustive unlock region, wherein the lock region is a percentage of the period of the recovered clock;

wherein said dividing means has an input coupled to an output of the phase detector means, and means for determining when n successive data transitions have occurred within lock regions, where n is a preselected positive integer, said determining means having a first input coupled to the trigger pulses and a second input coupled to an output of the dividing means;

wherein the determining means generates a signal of a first voltage level upon the occurrence of n successive data transitions within lock regions and a signal of a second voltage level otherwise, said signals being outputted onto a lock line that is coupled to the second input of the varying means.

4. Apparatus of claim 3 wherein the determining means further comprises means for inhibiting the outputting of a signal of the second voltage level when, after the lock line has been at the first voltage level, the period of time during which data transitions occur within unlock regions is less than a preselected inhibiting time built into said inhibiting means by a resistive/capacitive circuit.

5. Apparatus of claim 3 wherein said varying means further comprises:

a switch located at the second input of the varying means for switching the bit synchronizer into a frequency sweeping mode in response to a signal of the second voltage level appearing on said lock line, the switch having a first input coupled to the lock line; and an integrator for changing the voltage at a VCO input monotonically over time over a voltage range corresponding to the frequency range being swept, said integrator having an input coupled to an output of the switch and an output coupled to the VCO input.

6. Apparatus of claim 5 further comprising:
means for reversing the direction of voltage changes at the input of the VCO when the voltage reaches an endpoint of said voltage range, said reversing means having an input coupled to the output of the integrator and an output coupled to a second input of the switch.

* * * * *